(12) United States Patent
Hsue et al.

(10) Patent No.: US 6,495,877 B1
(45) Date of Patent: Dec. 17, 2002

(54) METAL CAPACITORS WITH DAMASCENE STRUCTURES AND METHOD FOR FORMING THE SAME

(75) Inventors: Chen-Chiu Hsue, Hsinchu (TW); Shyh-Dar Lee, Hsinchu Hsien (TW)

(73) Assignee: Silicon Integrated Systems Corp., Hsin Chu (TW)

( * ) Notice: Subject to any disclaimer, the term of this patent is extended or adjusted under 35 U.S.C. 154(b) by 0 days.

(21) Appl. No.: 10/024,289

(22) Filed: Dec. 21, 2001

Related U.S. Application Data

(63) Continuation-in-part of application No. 09/880,782, filed on Jun. 15, 2001, now Pat. No. 6,338,999.

(51) Int. Cl.⁷ .......................................... H01L 21/8242
(52) U.S. Cl. ........................ 257/306; 438/687; 438/253
(58) Field of Search .......................... 438/3, 238–240, 438/250–256, 381, 393–396, 687; 257/303–309

(56) References Cited

U.S. PATENT DOCUMENTS

| | | | |
|---|---|---|---|
| 5,976,928 A | * 11/1999 | Kirlin et al. | 438/240 |
| 6,008,084 A | 12/1999 | Sung | |
| 6,008,085 A | 12/1999 | Sung et al. | |
| 6,025,226 A | 2/2000 | Gambino et al. | |
| 6,239,010 B1 | * 5/2001 | Lu | 438/239 |

* cited by examiner

Primary Examiner—Jey Tsai
(74) Attorney, Agent, or Firm—Birch, Stewart, Kolasch & Birch, LLP

(57) ABSTRACT

This invention provides a metal capacitor with damascene structures. Before the thin-film capacitor is formed, the underlying interconnections, such as a first Cu wire and a second Cu wire, are fabricated with Cu by damascene processes. The thin-film capacitor composed of a first metal layer contacting the first Cu wire, a dielectric layer and a second metal layer is formed in an insulator and a stop layer. A first Cu damascene structure and a second Cu damascene structure are disposed on the thin-film capacitor and the second Cu wire, respectively.

17 Claims, 7 Drawing Sheets

METAL CAPACITORS WITH DAMASCENE STRUCTURES AND METHOD FOR FORMING THE SAME

This application is a continuation-in-part of U.S. application Ser. No. 09/880,782, filed Jun. 15, 2001 now U.S. Pat. No. 6,338,999, now allowed.

BACKGROUND OF THE INVENTION

1. Field of the Invention

The present invention relates in general to an integrated circuit including capacitors. In particular, the present invention relates to capacitors with damascene structures and method for forming the same.

2. Description of the Related Art

Capacitors are deployed in various integrated circuits. For example, capacitors can be used as decoupling capacitors to provide improved voltage regulation and noise immunity for power distribution. Capacitors also have wide applications in analog/logic, analog-to-digital, mixed signal, radio frequency circuits and so on.

A conventional method of manufacturing a semiconductor apparatus including a capacitor 20 formed of metal-insulator-metal layers is described with reference to FIGS. 1A~1D. As shown in FIG. 1A, an aluminum layer is deposited on an insulator 12 which contains interconnections and is formed on a silicon substrate having devices (not shown) thereon and therein. The aluminum layer is then patterned by masking and etching to form wires 14a and 14b. As shown in FIG. 1B, an insulator 16 with a tungsten plug 18 (hereafter "W-plug") used to connect the aluminum wire 14a and the to-be-formed capacitor is formed on the aluminum wires 14a and 14b and the insulator 12. As shown in FIG. 1C, a first conductive plate 21, a dielectric layer 22 and a second conductive plate 23 are sequentially deposited on the insulator 16 and the W-plug 18, and then patterned by masking and etching to obtain a capacitor 20. The first conductive plate 21, the bottom electrode, is connected with the aluminum wire 14a through the W-plug 18. Another insulator 26 is deposited on the insulator 16 and the capacitor 20. The insulators 16 and 26 are patterned and W-plug 28a and W-plug 28b are formed therein. As shown in FIG. 1D, an aluminum layer (not shown) is deposited on the insulator 26 and the W-plugs 28a and 28b. The aluminum layer is then patterned by masking and etching to form wires 34a and 34b. The aluminum wire 34a is connected with the second conductive plate 23 through the W-plug 28a. The aluminum wire 34b is connected with the aluminum wire 14b through the W-plug 28b.

This method for integrating the capacitor 20 into an integrated circuit requires several masking and etching steps to form the capacitor 20, which may increase overall fabrication costs. Moreover, if a greater capacitance of the plane capacitor 20 is required, a greater area of the plane capacitor 20 is needed. This will sacrifice the spaces between the capacitor 20 and the nearby wires and make scaling down difficult. Furthermore, a drop height exists between the capacitor area and the non-capacitor area, resulting in an uneven topography of the insulator 26.

A method of manufacturing a capacitor while simultaneously forming a dual damascene via is disclosed in U.S. Pat. No. 6,025,226. In the '226 patent, a conductor which is used to form a bottom electrode is deposited in the openings for the via and capacitor. However, the conductor should be sufficiently thick to fill the via opening and sufficiently thin to not planarize the capacitor opening. It is difficult to form such a conductor.

Besides, the aluminum used to fabricate the traditional interconnections cannot satisfy the trends of enhanced integration and speed of data transmission. Copper (Cu) has high electric conductivity to reduce RC delay and can be substituted for aluminum as conducting wires. The use of copper as the conducting wires requires the use of processes, that is, damascene processes, because copper cannot be patterned by etching processes. This is because the boiling point of copper chloride ($CuCl_2$) produced by copper and the chlorine plasma usually used to etch metal is relatively high, about 1500° C. Therefore, Cu processes should be used to fabricate an integrated circuit including a capacitor.

SUMMARY OF THE INVENTION

It is an object of the present invention to provide a method for forming metal capacitors with a damascene process.

It is another object of the invention to reduce the number of masking and etching steps in manufacturing an integrated circuit including a capacitor.

Yet another object of the invention is to reduce the cost of manufacturing an integrated circuit including a capacitor.

It is a further object of the invention to reduce the drop height existing between the capacitor area and the non-capacitor area.

Still another object of the invention is to provide easily controllable processes of manufacturing an integrated circuit including a capacitor.

Another object of the invention is to use the Cu processes to fabricate the integrated circuit including capacitors to reduce RC delay.

Another object of the invention is to provide metal capacitors with damascene structures.

The present invention provides a metal capacitor with damascene structures. A first Cu wire and a second Cu wire are disposed in a first insulator. A second insulator with an opening is disposed on the first insulator, wherein the opening is positioned on the first Cu wire. A stop layer is disposed on the second insulator, and the opening in the second insulator is extended to the stop layer. A first metal layer is conformally disposed in the opening and contacts the surface of the first Cu wire. A dielectric layer is conformally disposed on the first metal layer in the opening. A second metal layer is conformally disposed on the dielectric layer in the opening. A third insulator is disposed on the stop layer and the second metal layer. A first Cu damascene structure and a second Cu damascene structure are disposed in the second and third insulators and the stop layer, wherein the first Cu damascene structure is composed of a third Cu wire and a first Cu plug and the second Cu damascene structure is composed of a fourth Cu wire and a second Cu plug, wherein the second metal layer is connected with the third Cu wire through the first Cu plug, and the fourth Cu wire is connected with the second Cu wire through the second Cu plug. A first sealing layer is disposed between the second Cu wire and the second insulator. A second sealing layer is disposed on the third and fourth Cu wires.

The present invention provides a method for forming the above-mentioned metal capacitor with a damascene process. Before fabricating the thin-film capacitor, a first Cu wire and a second Cu wire, surrounded with a barrier layer and a first sealing layer, are prepared in a first insulator. A second insulator is formed on the sealing layer. A stop layer is formed on the second insulator. An opening is formed in the stop layer, the second insulator and the sealing layer and the first Cu wire is exposed. A first metal layer, a third insulator and a second metal layer are conformally formed, in turn, in the opening on the stop layer. A chemical mechanical polishing process is executed to remove the first metal layer, the third insulator and the second metal layer until the stop layer is exposed; thereby, a bottom electrode, a capacitor dielectric and an upper electrode are formed in the opening respectively. The bottom electrode is connected to the first Cu wire. A fourth insulator having dual damascene structures is formed over the capacitor and the stop layer.

These and other objects of the present invention will become readily apparent upon further review of the following specification and drawings.

BRIEF DESCRIPTION OF THE DRAWINGS

The present invention will become more fully understood from the detailed description given herein and the accompanying drawings, given by way of illustration only and thus not intended to be limitative of the present invention.

DETAILED DESCRIPTION OF THE PREFERRED EMBODIMENT

Figure 1A:
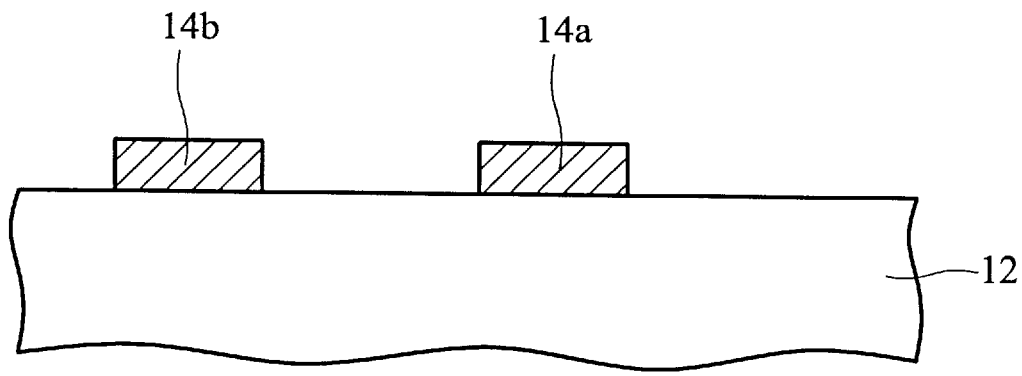
FIGS. 1A~1D depict the method for integrating the capacitors into the interconnection processes according to the prior art.
Figure 1B:
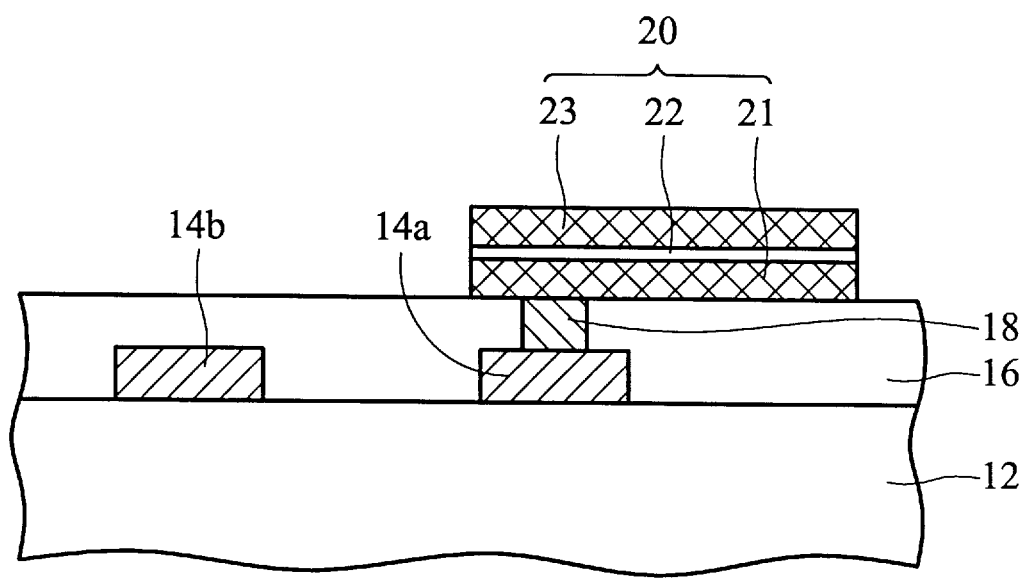
Figure 1C:
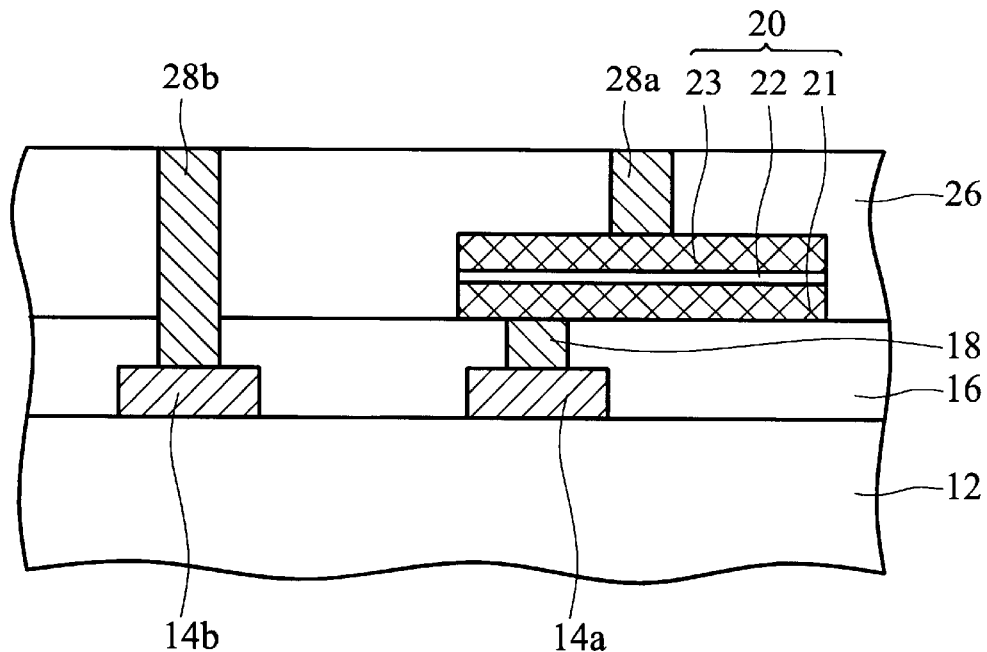
Figure 1D:
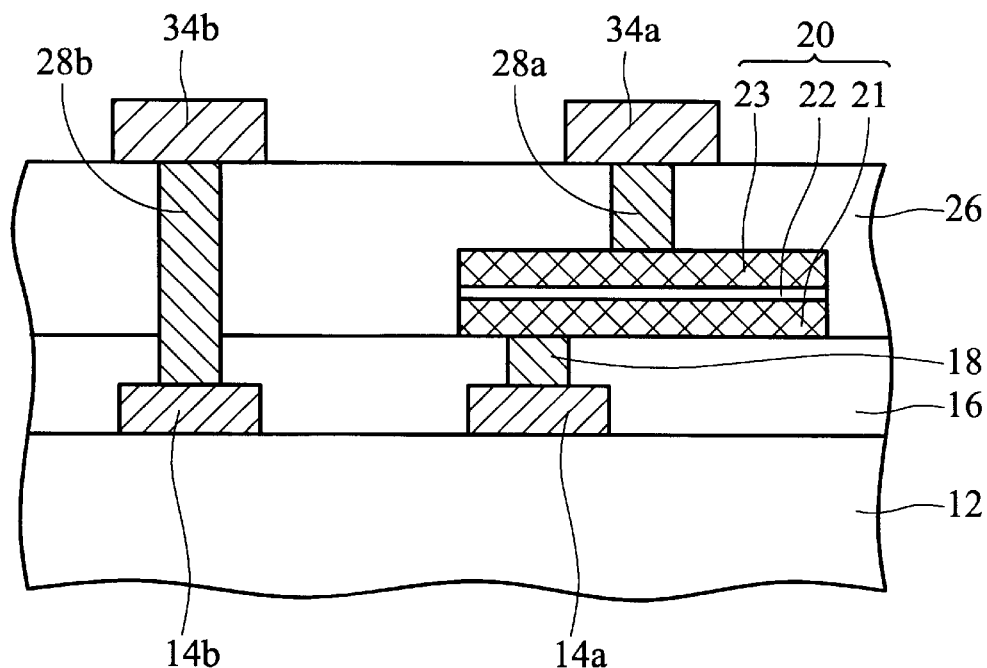

The present invention provides a thin-film capacitor which can be integrated into Cu damascene structures. Before the thin-film capacitor is formed, the underlying interconnections, such as a first Cu wire and a second Cu wire, are fabricated with Cu by damascene processes. The thin-film capacitor is composed of a first metal layer contacting the first Cu wire, a dielectric layer and a second metal layer. A first Cu damascene structure and a second Cu damascene structure are disposed on the thin-film capacitor and the second Cu wire, respectively. The structure is shown in FIG. 2J, and the detailed description of the structure is given here.

The Cu wire 104a and the Cu wire 104b are disposed in the insulator 106. The insulator 110 with the opening 112 is disposed on the insulator 106, wherein the opening 112 is positioned on the Cu wire 104a. The stop layer 150 is disposed on the insulator 110, and the opening 112 in the insulator 110 is extended to the stop layer 150. The first metal layer 114 is conformally disposed in the opening 112 and contacts the surface of the Cu wire 104a. The dielectric layer 116 is conformally disposed on the first metal layer 114 in the opening 112. The second metal layer 118 is conformally disposed on the dielectric layer 116 in the opening 112. The insulator 120 is disposed on the stop layer 150 and the second metal layer 118. A first Cu damascene structure and a second Cu damascene structure are disposed in the insulators 110 and 120 and the stop layer 150, wherein the first Cu damascene structure is composed of the Cu wire 130a and the Cu plug 128a and the second Cu damascene structure is composed of the Cu wire 130b and the Cu plug 128b, wherein the second metal layer 118 is connected with the Cu wire 130a through the Cu plug 128a, and the Cu wire 130b is connected with the Cu wire 104b through the Cu plug 128b. The sealing layer 108 is disposed between the Cu wire 104b and the insulator 110. The sealing layer 132 is disposed on the Cu wires 130a and 130b.

The following embodiment disposes an example method of forming the capacitors with damascene structures.

EMBODIMENT

A method for forming metal capacitors with a damascene process according to the embodiment of the present invention is described here with reference to FIGS. 2A~2J.

Figure 2A:
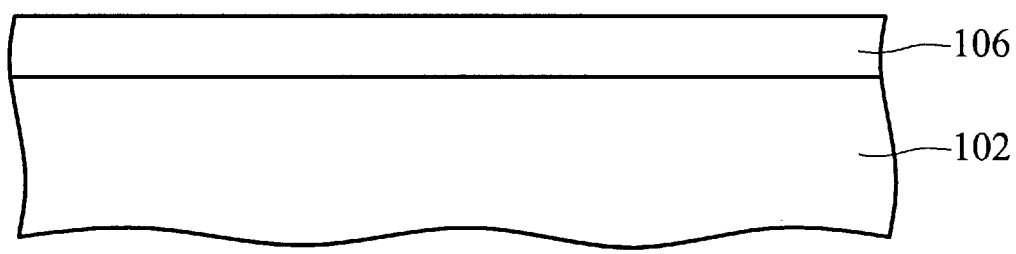
FIGS. 2A~2J depict the method for forming a metal capacitor with a damascene process according to the embodiment of the present invention.

In FIG. 2A, the insulator 106, preferably about 2,000~6,000 Å, is formed on the insulator 102. The insulator 102 may include interconnections and is formed on a substrate, such as a silicon semiconductor substrate, which includes numerous devices thereon and therein. The particular design of the underlying integrated circuit has not been shown in order to more clearly describe and show the aspects of the present invention.

Figure 2B:
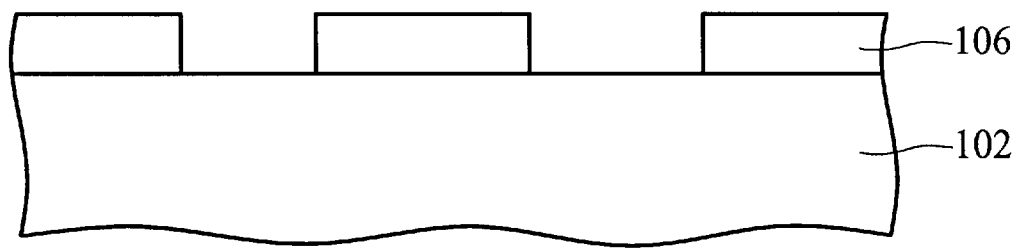

As shown in FIG. 2B, the insulator 106 is patterned by etching to form openings therein.

Figure 2C:
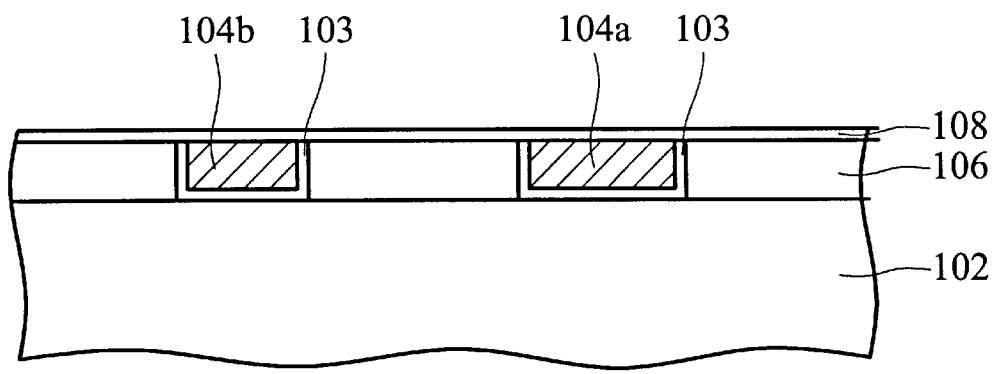

As shown in FIG. 2C, a barrier layer 103 is conformally formed on the insulator 106 in the openings. Copper metal is then formed on the barrier layer 103 and filled in the openings. A chemical mechanical polish (CMP) process is executed to remove the undesirable copper and barrier layer 103 to form copper wires 104a and 104b. A sealing layer 108, preferably about 100~400 Å in thickness, is formed at least on the Cu wires 104a and 104b. In this figure the sealing layer 132 is formed on the insulator 120 and the Cu wires 130a and 130b as an example. The material of the sealing layer 108 can be silicon nitride or silicon carbide.

Figure 2D:
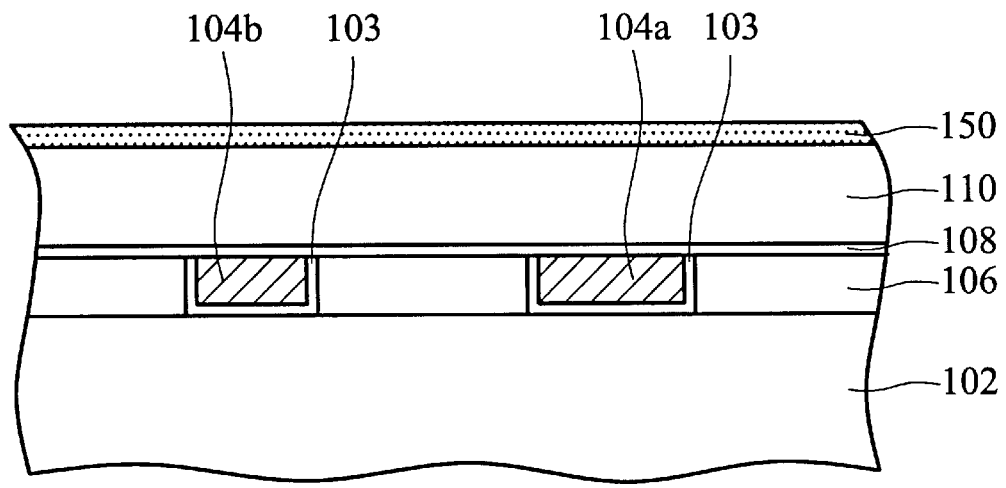

Referring to FIG. 2D, an insulator 110 is formed on the sealing layer 108. A stop layer 150, preferably about 300~1000 Å in thickness, is formed on the insulator 110 for stopping the subsequent CMP process. The material of the stop layer 150 can be silicon nitride or other dielectric materials.

Figure 2E:
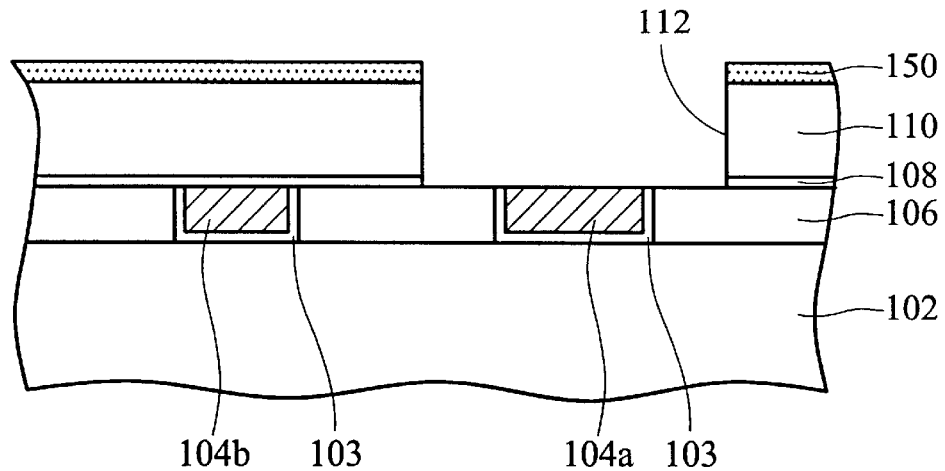

Referring to FIG. 2E, an opening 112 is formed in the stop layer 150, the insulator 110 and the sealing layer 108 exposing the surface of the copper wire 104a which will contact a bottom electrode. The opening 112 is defined to form a capacitor including a bottom electrode, a dielectric layer and an upper electrode. The height of the insulator 110 and the area of the opening 112 control the capacitance of the capacitor. Therefore, the capacitance of the capacitor can be increased without sacrificing the spaces between the capacitor and the nearby wires. Thus, an integrated circuit including the capacitor can be scaled down easily.

Figure 2F:
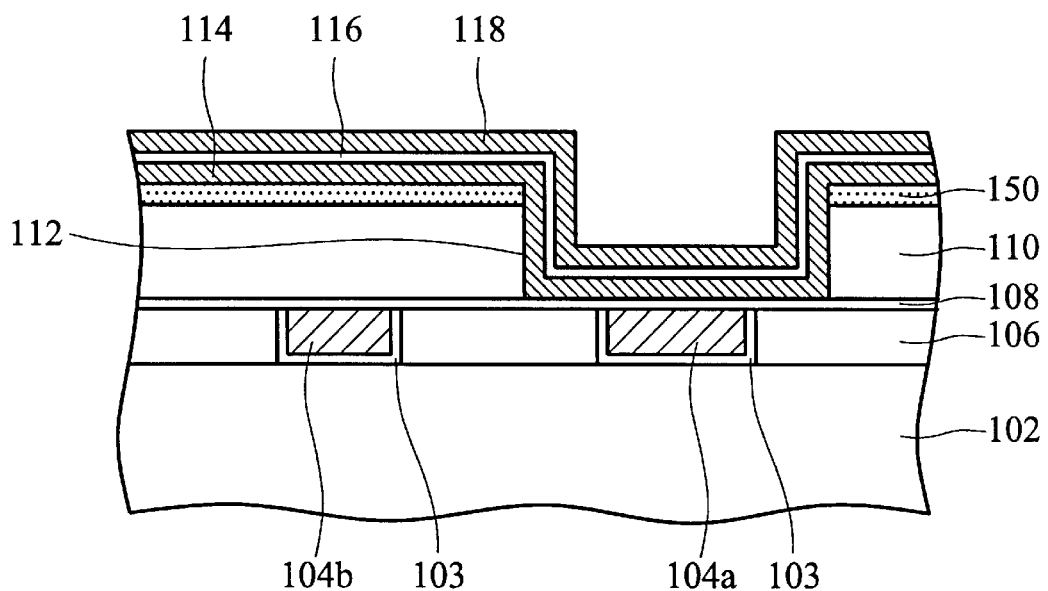

With reference to FIG. 2F, a first metal layer 114, a dielectric layer 116 and a second metal layer 118 are conformally formed on the stop layer 150 in the opening 112. The first metal layer 114 has a thickness ranging from 100 to 2,000 Å. The dielectric layer 116 has a thickness ranging from 100 to 1,200 Å. The thickness of this dielectric layer 116 depends on the particular application of the capacitor and the desired capacitance. The second metal layer 118 has a thickness ranging from 100 to 2,000 Å. The material used to form the first metal layer 114 and the second metal layer 118 can be titanium (Ti), titanium nitride (TiN), tantalum (Ta), tantalum nitride (TaN), aluminum (Al), aluminum copper alloy (AlCu), or the like. The material used to form the dielectric layer 116 has a high dielectric constant, which can be silicon nitride ($Si_3N_4$), silicon oxynitride (SiON), silicon carbide (SiC), tantalum oxide ($TaO_2$), zirconium oxide ($ZrO_2$), hafnium oxide ($HfO_2$), aluminum oxide ($Al_2O_3$) or other high dielectric constant materials.

Figure 2G:
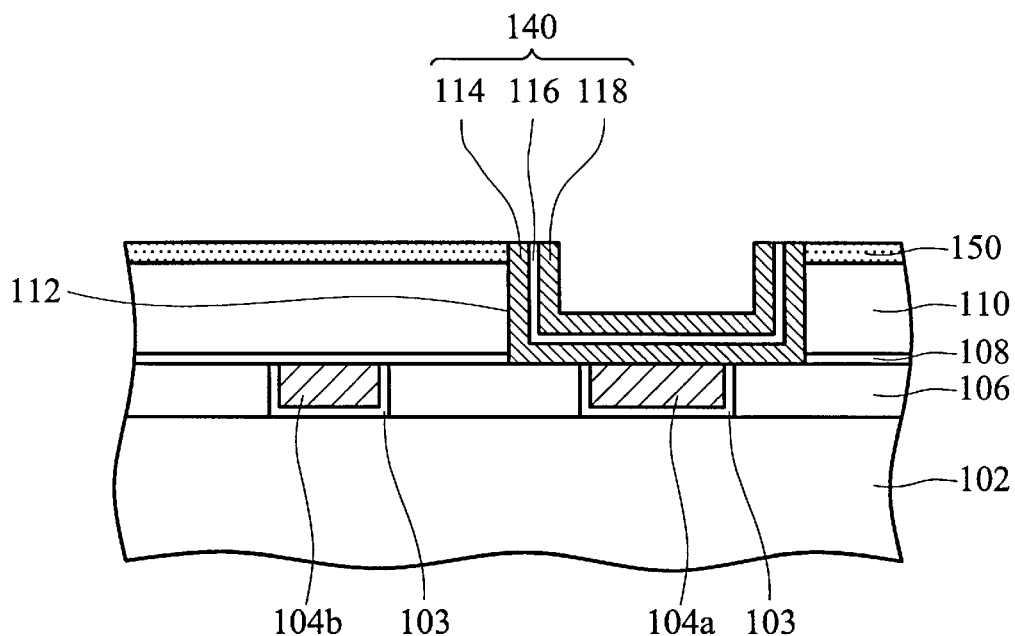

With reference to FIG. 2G, chemical mechanical polish (CMP) removes the undesirable first metal layer 114, the undesirable dielectric layer 116 and the undesirable second metal layer 118 until the stop layer 150 is exposed. The first metal layer 114 remaining in the opening 112 functions as a bottom electrode, while the remaining dielectric layer 116 functions as a capacitor dielectric, and the remaining second metal layer 118 functions as an upper electrode, thereby obtaining the capacitor 140. The bottom electrode 114 contacts the Cu wire 104a.

According to the above-mentioned steps of forming the capacitor 140, only one mask is needed to define the opening 112 for imbedding the capacitor 140 therein, and chemical mechanical polishing technology is used to define the capacitor 140. Therefore, the number of masking and etching steps is reduced and the cost of manufacturing the integrated circuit including the capacitor 140 is reduced. Moreover, the drop height between the capacitor area and the non-capacitor area is avoided.

Figure 2H:
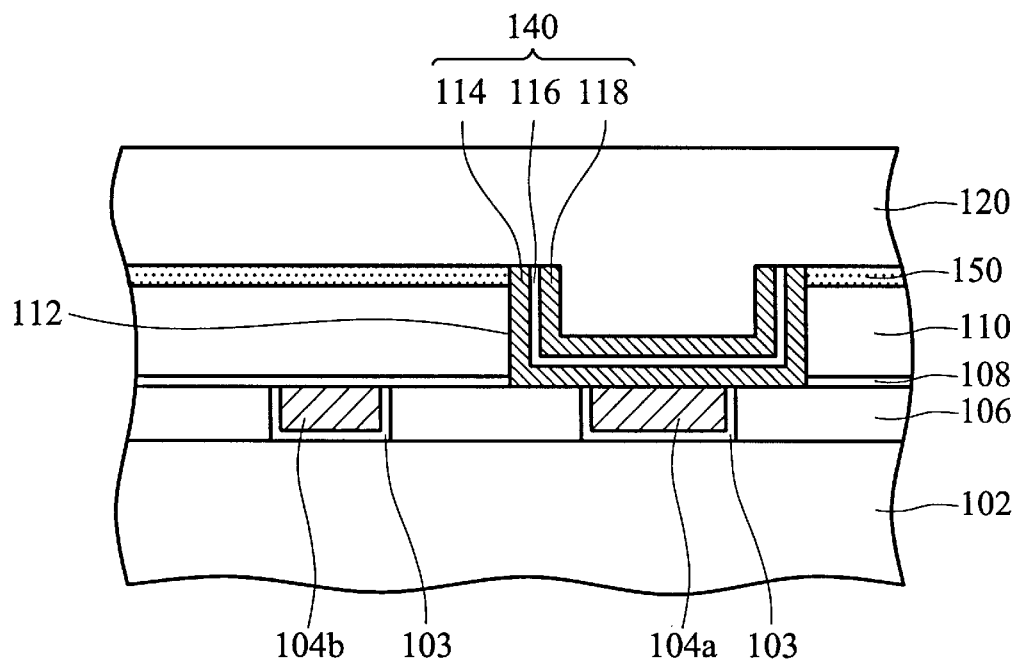

As shown in FIG. 2H, an insulator 120 is formed on the capacitor 140 and the stop layer 150.

Figure 2I:
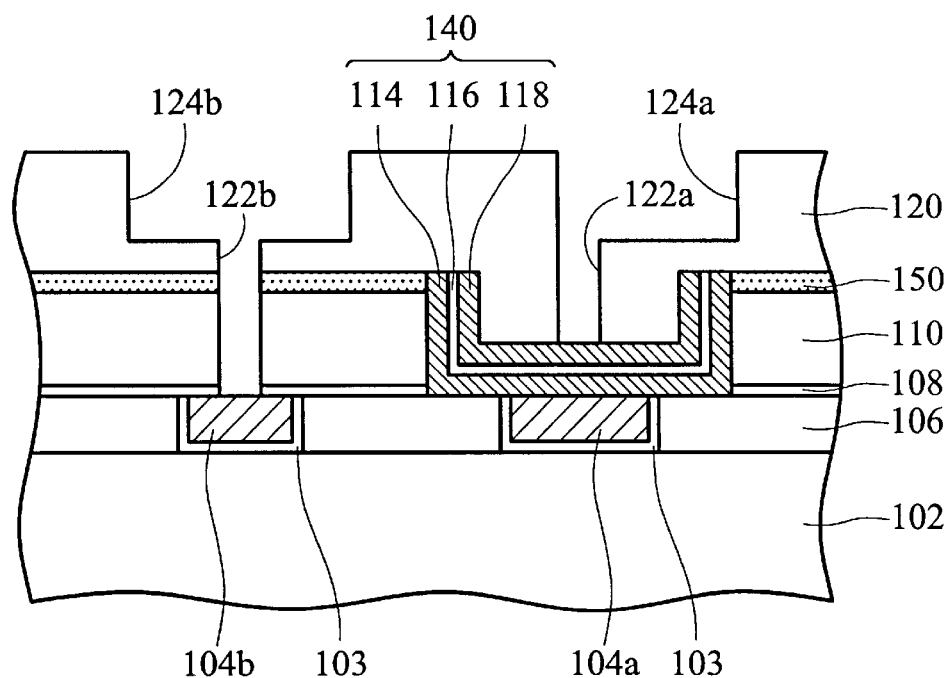
Figure 2J:
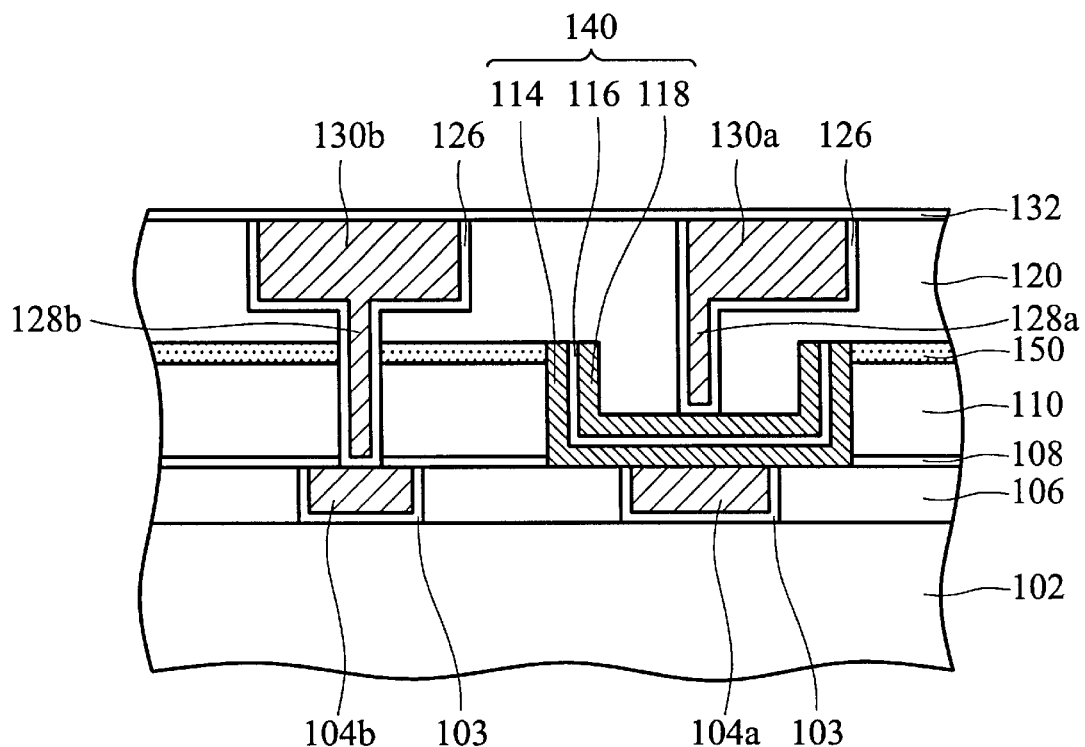

A dual damascene process is proceeded, as shown in FIGS. 2I and 2J. Dual damascene patterns, including trenches 124a and 124b and vias 122a and 122b, are formed in the insulator 120, the stop layer 150, the insulator 110 and the sealing layer 108. The via 122b exposes the surface of the Cu wire 104b, and the via 122a exposes the surface of the upper electrode 118.

With reference to FIG. 2J, a barrier layer 126 is conformally formed on the insulators 120, in the trenches 124a and 124b and vias 122a and 122b. Cu is formed above the barrier layer 126 and fills the trenches 124a and 124b and vias 122a and 122b. Chemical mechanical polishing removes the undesirable Cu and the barrier layer 126 to form Cu wires 130a and 130b and Cu plugs 128a and 128b. A sealing layer 132 is formed at least on the Cu wires 130a and 130b. In this figure the sealing layer 132 is formed on the insulator 120 and the Cu wires 130a and 130b as an example. The material used to fabricate the sealing layer 132 can be silicon nitride or silicon carbide, which are used to prevent the Cu atoms of the wires 130a and 130b from diffusing. The upper electrode 118 is connected with the Cu wire 130a through the Cu plug 128a, and the Cu wire 104b is connected with the Cu wire 130b through the Cu plug 128b.

Sequential interconnection processes (e.g. Cu processes) are performed until the interconnections are complete.

The above-mentioned insulators 102, 106, 110 and 120 can be formed by low dielectric constant (K) materials, such as doped or undoped silicon oxide, SOP low K material, such as FLARE®, Si4C®, PAE-II® and so on, and CVD low K material, such as blackdiamond™ (BD™), Coral™, Greendot™, Aurora™ and so on.

While the present invention is described by preferred embodiments, it should be understood that the invention is not limited to these embodiments in any way. On the contrary, it is intended to cover all the modifications and arrangements as they would be apparent to those skilled in the art. Therefore, the scope of the appended claims should be interpreted in the broadest sense so as to encompass all the modifications and arrangements.

What is claimed is:

1. A metal capacitor with damascene structures, comprising:

a first Cu wire and a second Cu wire disposed in a first insulator;

a second insulator having an opening disposed on the first insulator, wherein the opening is positioned on the first Cu wire;

a stop layer disposed on the second insulator, wherein the opening in the second insulator is extended to the stop layer;

a first metal layer conformally disposed in the opening and contacting the surface of the first Cu wire;

a dielectric layer conformally disposed on the first metal layer in the opening;

a second metal layer conformally disposed on the dielectric layer in the opening;

a third insulator disposed on the stop layer and the second metal layer;

a first Cu damascene structure and a second Cu damascene structure disposed in the second and third insulators and the stop layer, wherein the first Cu damascene structure is composed of a third Cu wire and a first Cu plug and the second Cu damascene structure is composed of a fourth Cu wire and a second Cu plug, wherein the second metal layer is connected with the third Cu wire through the first Cu plug, and the fourth Cu wire is connected with the second Cu wire through the second Cu plug;

a first sealing layer disposed between the second Cu wire and the second insulator; and a second sealing layer disposed on the third and fourth Cu wires.

2. The metal capacitor with damascene structures as claimed in claim 1, wherein the material of the first metal layer is selected from the group consisting of titanium (Ti), titanium nitride (TiN), tantalum (Ta), tantalum nitride (TaN), aluminum (Al), and aluminum copper alloy (AlCu).

3. The metal capacitor with damascene structures as claimed in claim 1, wherein the material of the dielectric layer is selected from the group consisting of silicon nitride ($Si_3N_4$) silicon oxynitride (SiON), silicon carbide (SiC), tantalum oxide ($TaO_2$), zirconium oxide ($ZrO_2$), hafnium oxide ($HfO_2$), and aluminum oxide ($Al_2O_3$).

4. The metal capacitor with damascene structures as claimed in claim 1, wherein the material of the second metal layer is 3 selected from the group consisting of titanium (Ti), titanium nitride (TiN), tantalum (Ta), tantalum nitride (TaN), aluminum (Al), and aluminum copper alloy (AlCu).

5. The metal capacitor with damascene structures as claimed in claim 1, wherein the material of the stop layer is silicon nitride.

6. The metal capacitor with damascene structures as claimed in claim 1, wherein the thickness of the first metal layer ranges from 100 to 2,000 Å.

7. The metal capacitor with damascene structures as claimed in claim 1, wherein the thickness of the dielectric layer ranges from 100 to 1,200 Å.

8. The metal capacitor with damascene structures as claimed in claim 1, wherein the thickness of the second metal layer ranges from 100 to 2,000 Å.

9. A method for forming a metal capacitor with damascene structures, comprising:

providing a first insulator;

forming a first Cu wire and a second Cu wire in the first insulator;

forming a first sealing layer at least on the first and second Cu wires;

forming a second insulator on the first sealing layer;

forming a stop layer on the second insulator;

forming an opening exposing the first Cu wire in the stop layer, the second insulator and the first sealing layer;

conformally forming a first metal layer on the stop layer in the opening;

conformally forming a dielectric layer on the first metal layer;

conformally forming a second metal layer on the dielectric layer;

removing the first metal layer, the dielectric layer and the second metal layer to expose the stop layer;

forming a third insulator on the stop layer and the second metal layer;

forming dual damascene patterns included trenches and holes in the third insulator, the stop layer and the second insulator;

forming a third Cu wire and a fourth Cu wire in the trenches and a first Cu plug and a second Cu plug in the holes, wherein the second metal layer is connected with the third Cu wire through the first Cu plug, and the fourth Cu wire is connected with the second Cu wire through the second Cu plug; and forming a second sealing layer at least on the third and fourth Cu wires.

10. The method as claimed in claim 9, wherein the material of the first metal layer is selected from the group consisting of titanium (Ti), titanium nitride (TiN), tantalum (Ta), tantalum nitride (TaN), aluminum (Al), and aluminum copper alloy (AlCu).

11. The method as claimed in claim 9, wherein the material used to form the dielectric layer is selected from the group consisting of silicon nitride ($Si_3N_4$), silicon oxynitride (SiON), silicon carbide (SiC), tantalum oxide ($TaO_2$), zirconium oxide ($ZrO_2$), hafnium oxide ($HfO_2$), and aluminum oxide ($Al_2O_3$).

12. The method as claimed in claim 9, wherein the material of the second metal layer is selected from the group consisting of titanium (Ti), titanium nitride (TiN), tantalum (Ta), tantalum nitride (TaN), aluminum (Al), and aluminum copper alloy (AlCu).

13. The method as claimed in claim 9, wherein the method used to remove the first metal layer, the dielectric layer and the second metal layer to expose the stop layer is a chemical mechanical polishing process.

14. The method as claimed in claim 9, wherein the material of the stop layer is silicon nitride.

15. The method as claimed in claim 9, wherein the thickness of the first metal layer ranges from 100 to 2,000 Å.

16. The method as claimed in claim 9, wherein the thickness of the dielectric layer ranges from 100 to 1,200 Å.

17. The method as claimed in claim 9, wherein the thickness of the second metal layer ranges from 100 to 2,000 Å.

\* \* \* \* \*